US009941224B2

(12) United States Patent
Lamar et al.

(10) Patent No.: US 9,941,224 B2
(45) Date of Patent: Apr. 10, 2018

(54) MULTI-DIE INTEGRATED CIRCUIT DEVICE WITH CAPACITIVE OVERVOLTAGE PROTECTION

(71) Applicant: Allegro MicroSystems, LLC, Worcester, MA (US)

(72) Inventors: Washington Lamar, Mount Vernon, NH (US); Maxim Klebanov, Newton, MA (US)

(73) Assignee: Allegro MicroSystems, LLC, Worcester, MA (US)

( * ) Notice: Subject to any disclaimer, the term of this patent is extended or adjusted under 35 U.S.C. 154(b) by 0 days.

(21) Appl. No.: 15/245,699

(22) Filed: Aug. 24, 2016

(65) Prior Publication Data
US 2018/0061784 A1   Mar. 1, 2018

(51) Int. Cl.
| H01L 29/00 | (2006.01) |
| H01L 23/60 | (2006.01) |
| H01L 23/495 | (2006.01) |
| H01L 23/31 | (2006.01) |
| H01L 25/065 | (2006.01) |
| H01L 21/48 | (2006.01) |
| H01L 21/56 | (2006.01) |
| H01L 25/00 | (2006.01) |

(52) U.S. Cl.
CPC .......... *H01L 23/60* (2013.01); *H01L 21/4825* (2013.01); *H01L 21/563* (2013.01); *H01L 23/3142* (2013.01); *H01L 23/49513* (2013.01); *H01L 23/49524* (2013.01); *H01L 23/49589* (2013.01); *H01L 25/0657* (2013.01); *H01L 25/50* (2013.01); *H01L 2225/06558* (2013.01); *H01L 2225/06562* (2013.01)

(58) Field of Classification Search
CPC .................. H01L 23/60; H01L 21/4825
USPC ............................................. 257/68
See application file for complete search history.

(56) References Cited

U.S. PATENT DOCUMENTS

| 2007/0075409 A1* | 4/2007 | Letterman, Jr. ....... H01L 21/561 257/678 |
| 2008/0265389 A1* | 10/2008 | Hsu .................. H01L 23/49838 257/686 |
| 2011/0026173 A1* | 2/2011 | Karp .................. H01L 27/0266 361/56 |

(Continued)

OTHER PUBLICATIONS

Response to Office Action filed May 25, 2017 for U.S. Appl. No. 15/245,689; 12 pages.

(Continued)

*Primary Examiner* — Jami M Valentine
(74) *Attorney, Agent, or Firm* — Daly, Crowley, Mofford & Durkee, LLP (57) ABSTRACT

An electronic device includes a package, a plurality of external leads extending outside the package, a first die within the package having one or more first contacts electrically coupled to at least a first one of the external leads, and a second die within the package having one or more second contacts electrically coupled to at least a second one of the external leads. A capacitive coupling may be positioned between the first and second die to allow electrostatic discharge (ESD) current to flow between the first die and the second die in response to an ESD event and to electrically isolate the first and second die from each other in the absence of the ESD event.

18 Claims, 6 Drawing Sheets

(56) References Cited

U.S. PATENT DOCUMENTS

| | | |
|---|---|---|
| 2011/0175699 A1 | 7/2011 | Huss et al. |
| 2014/0098448 A1 | 4/2014 | Henderson et al. |
| 2014/0210108 A1 | 7/2014 | Park |
| 2016/0190918 A1* | 6/2016 | Ho .......................... H01L 23/48 327/530 |
| 2017/0250143 A1* | 8/2017 | Wilkinson .............. H01L 23/60 |

OTHER PUBLICATIONS

Response to Office Action filed Aug. 2, 2017 for U.S. Appl. No. 15/245,689, 20 pages.
U.S. Appl. No. 15/245,689, filed Aug. 24, 2016, Klebanov, et al.
U.S. Appl. No. 15/053,397, filed Feb. 25, 2016, Wilkinson, et al.
U.S. Non-Final Office Action dated Feb. 27, 2017 for U.S. Appl. No. 15/245,689; 19 Pages.
U.S. Non-Final Office Action dated Oct. 10, 2017 for U.S. Appl. No. 15/245,689; 20 pages.
Response to U.S. Non-Final Office Action dated Oct. 10, 2017 for U.S. Appl. No. 15/245,689; Response filed Dec. 21, 2017; 6 Pages.

* cited by examiner

MULTI-DIE INTEGRATED CIRCUIT DEVICE WITH CAPACITIVE OVERVOLTAGE PROTECTION

FIELD

This application relates to overvoltage and/or electrostatic discharge (ESD) protection and, more particularly, to capacitive overvoltage and/or ESD protection for multi-die integrated circuit (IC) devices.

BACKGROUND

Electronic devices sometimes operate in environments that can damage the components and devices. Installation of a device in an automobile, for example, can expose electronic devices to stress conditions that can cause damage to the part. As an example, static charge that has built up can transfer to the electronic device during handling, installation, or inspection. Devices used in manufacturing environments can also experience power fluctuations. If for example, a power-hungry system or process draws on the manufacturing plant's electrical system, interruptions or fluctuations in power can occur that affect any device connected to the plant's power infrastructure. If the electronic device has multiple semiconductor die, such stresses can cause electrical current to arc between the die and potentially damage the electronic device.

For example, electronic devices may be subject to electrical overstress ("EOS") conditions such as an electrostatic discharge ("ESD") event occurring between exposed pins or terminals of the device. These events can occur if there is a system fault or if the electronic device is exposed to an external charge. For example, the human body can store a charge that can correlate into a stored voltage as high as 25 kV. If a charged body touches an external terminal of the electronic device, that charge can be transferred to and potentially damage the device. Many devices contain ESD protection circuits that provide paths for current due to ESD events to flow without damaging internal circuitry of the device.

SUMMARY

In an embodiment, an apparatus includes a package, a plurality of external leads extending outside the package, a first die within the package having one or more first contacts electrically coupled to at least a first one of the external leads, and a second die within the package having one or more second contacts electrically coupled to at least a second one of the external leads. A capacitive coupling may be positioned between the first and second die to allow electrostatic discharge (ESD) current to flow between the first die and the second die in response to an ESD event and to electrically isolate the first and second die from each other in the absence of the ESD event.

In another embodiment, a method includes providing an electronic device having a package, two or more die, a first lead coupled to a first die of the two or more die, and a second lead coupled to a second die of the two or more die, and providing a capacitive coupling between the first and second leads so that electrostatic discharge can flow between the first die and the second die during handling of the electronic device.

BRIEF DESCRIPTION OF THE DRAWINGS

The foregoing features may be more fully understood from the following description of the drawings. The drawings are provided as examples to aid in describing the subject matter. As such, the drawings do not limit the scope of what is claimed.

Like reference numbers in the drawings may denote like elements.

DETAILED DESCRIPTION

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or perturbations in a magnetic field generated by a back bias magnet where the perturbations are caused by a rotating ferromagnetic article, and a magnetic field sensor that senses a magnetic field density of a magnetic field.

Magnetic field sensors often include driver circuits that can drive an output signal of the magnetic field sensor. These driver circuits often produce an output signal that switches between a high and low depending upon whether a magnetic field sensing element senses a magnetic target or a magnetic field of a particular strength. In some cases, depending upon the location where the magnetic field sensor is installed, the driver circuit may have to drive the output signal across a long conductor or cable harness. For example, if the magnetic field sensor is installed in a vehicle's transmission (e.g. on a camshaft), the conductor harness running from the magnetic field sensor to a central processor may be a few feet or a few meters in length. Such a long cable may be susceptible to EMI from the vehicle's engine, transmission, or other circuits.

As used herein, the term "DC" may refer to unidirectional flow of current. Such DC current may be associated with constant and/or steady state voltage and current values, such as the DC voltage and/or current produced by a battery or DC regulator. In various instances, DC current and voltage may comprise a frequency component of about 0 Hz.

Figure 1:
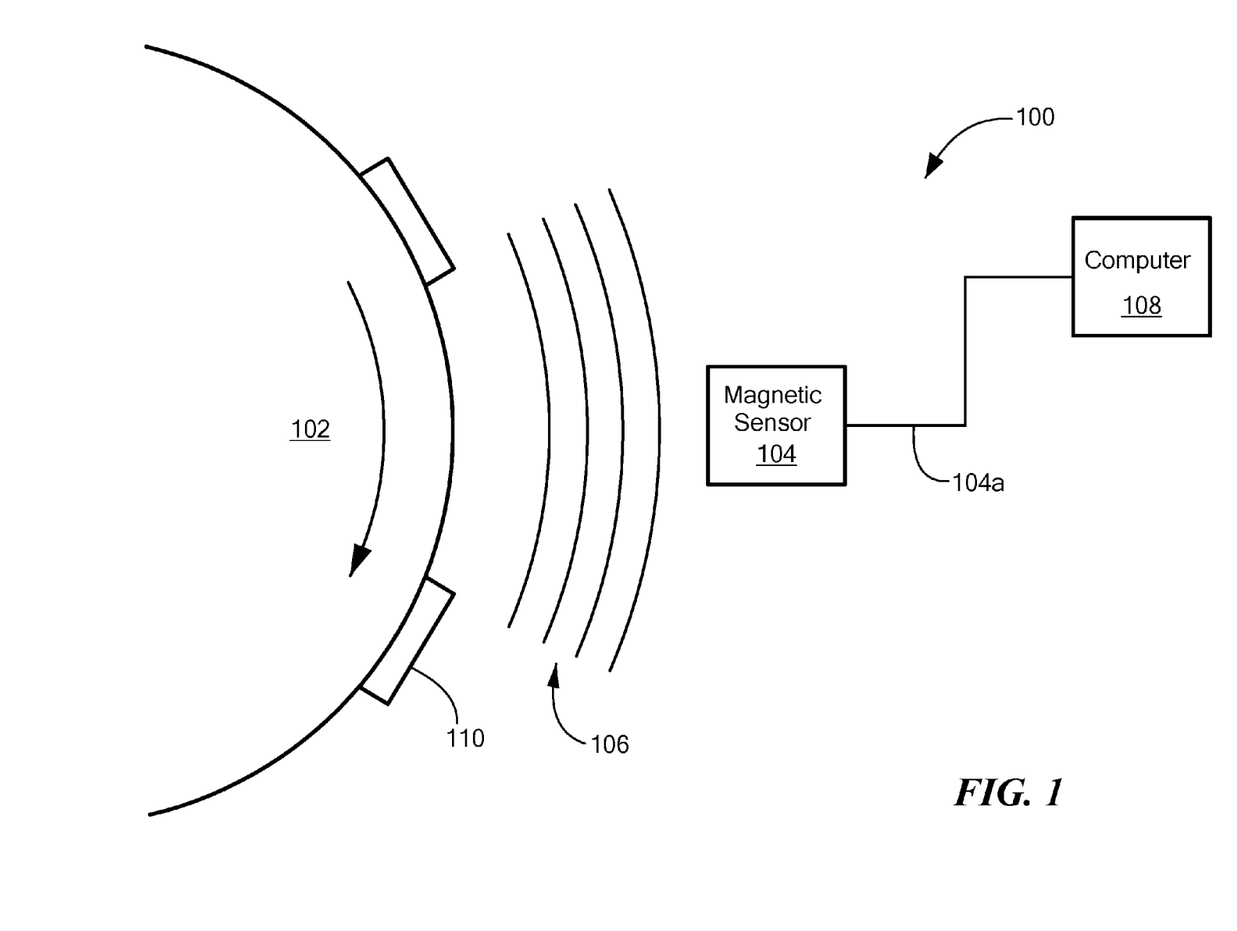
FIG. 1 is a schematic diagram of a system including a magnetic field sensor for detecting a magnetic target.

FIG. 1 is a block diagram of a system 100 for detecting a target 102. System 100 includes a magnetic field sensor 104 placed adjacent to target 102 so that a magnetic field 106 can be sensed by magnetic field sensor 104.

In an embodiment, target 102 is a magnetic target and produces magnetic field 106. In another embodiment, magnetic field 106 is generated by a magnetic source (e.g. a back-bias magnet or electromagnet) separate from the target 102. In such embodiments, target 102 may be a ferromagnetic target that does not itself tend to generate a magnetic field. In the case where the target is a ferromagnetic target, as target 102 moves through or within magnetic field 106 generated by a back-bias magnet or electromagnet, it causes perturbations to magnetic field 106 that can be detected by magnetic field sensor 104.

Magnetic field sensor 104 may be coupled to a computer 108, which may be a general purpose processor executing software or firmware, a custom processor, or an electronic circuit for processing output signal 104a from magnetic field sensor 104. Output signal 104a may provide information about the speed and/or direction of motion of target 102 to computer 108, which may then perform operations based on the received speed and direction. In an embodiment, magnetic field sensor 104 changes the state of output signal 104a when the detected magnetic field crosses a predetermined threshold.

In an embodiment, computer 108 is an automotive computer installed in a vehicle and target 102 is a moving part within the vehicle, such as a transmission shaft, a brake rotor, etc. Magnetic field sensor 104 detects the speed and/or direction of target 102 and computer 108 controls automotive functions (like all-wheel drive, ABS, etc.) in response to the detected speed and/or direction.

Target 102 can comprise any element capable of affecting magnetic field 106 through motion or proximity. For example, target 102 may be attached to a rotating shaft in an automotive transmission or brake system.

As shown in FIG. 1, target 102 may be a gear having teeth 110. As target 102 moves or rotates, teeth 110 affect magnetic field 106, which can be detected by magnetic field sensor 104. By detecting such changes to magnetic field 106, system 100 can determine speed and/or direction of target 102. Although shown as a rotating gear, target 102 can take on any form capable of being detected by magnetic sensor including, but not limited to: a toothed rack in a rack and pinion system; a gear, a gear with teeth, with magnets (e.g., a ring magnet), or other features on or attached to a shaft; etc. Also, although shown as separate elements, computer 108 and magnetic field sensor 104 may be part of the same circuit, part of the same integrated circuit, or contained in the same package.

Figure 2:
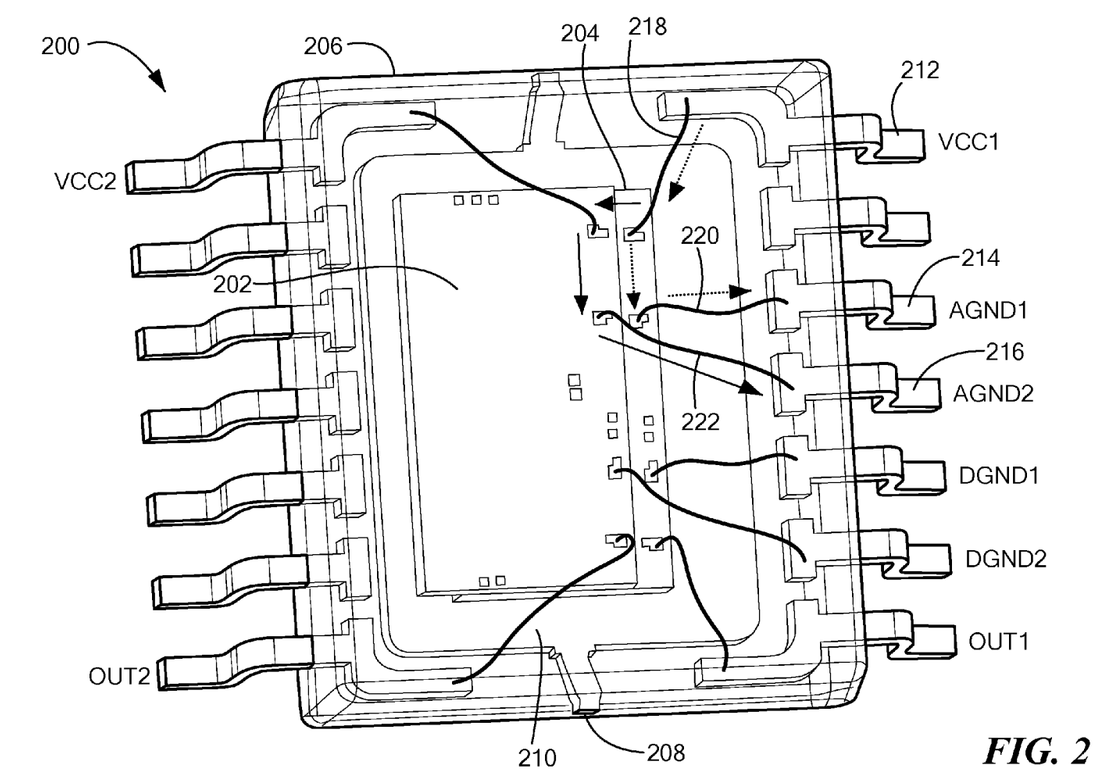
FIG. 2 is an isometric view of an integrated circuit device having multiple die.

Referring to FIG. 2, an integrated circuit (IC) device 200 includes a first die 202 and a second die 204 enclosed in an IC package 206. In an embodiment, IC device 200 is a magnetic field sensor similar to or the same as magnetic field sensor 104. IC device 200 may alternatively be any type of device containing more than one die, including other types of magnetic field sensors such as proximity detectors, switches, and/or current sensors, or even non-magnetic field sensing IC devices. The first and second die 202 and 204 may be semiconductor die that each support an electronic circuit. In an embodiment, first and second die 202 and 204 support identical circuits. In this case, the identical circuits may act as redundant circuits so that, if one of the circuits malfunctions, the other may continue to operate. In other embodiments, first and second die 202 and 204 support different circuits that perform different functions. Die 202 and 204 may also be non-semiconductor die, such as a ceramic die or fiberglass board, for example.

A lead frame 208 includes a die attach portion 210 on which first and second die 202 and 204 may be attached. In embodiments, first and second die 202 and 204 may be attached by adhesive or other means of attaching semiconductor die to a lead frame known in the art.

As shown in FIG. 2, first die 202 and second die 204 are positioned in an overlapping arrangement. In embodiments, first and second die 202 and 204 may be spaced apart and/or an electrical insulator may be placed between the die so that the die are electrically isolated from each other. In other embodiments, first and second die 202 and 204 may be positioned in other arrangements. For example, they may be positioned side-to-side, corner-to-corner, etc.

In embodiments, first and second die 202 and 204 are positioned so that they may be electrically isolated from each other. First and second die 202 and 204 may also have separate ground and power planes (e.g. separate ground and power leads) so they are electrically isolated from each other.

Leads (such as leads 212, 214, and 216) may be included as part of lead frame 208. Wire bonds (such as wire bonds 218, 220, and 222) provide electrical connections between leads and electrical contacts (or pads) on first and second die 202 and 204. In the embodiment shown, wire bond 218 provides an electrical connection between lead 212 and second die 204, wire bond 220 provides an electrical connection between lead 214 and second die 204, and wire bond 222 provides an electrical connection between lead 216 and first die 202. As shown in FIG. 2, other wire bonds may provide electrical connections between the die and leads as desired by design of integrated circuit 200.

The die 202 and 204 and a portion of the lead frame including die attach portion 210 are enclosed, such as by overmolding, with a non-conductive material, such as thermoset and thermoset mold compounds and other commercially available IC mold compounds to form the IC package or package body 206.

Leads 212-216 may extend outside of package 206 to provide electrical connections to external circuitry. For example, the external portions of leads 212-216 (and other leads of integrated circuit device 200) may be soldered to pads on a printed circuit board in order to connect integrated circuit device 200 to external circuitry supported by the printed circuit board.

Conduction paths through IC device 200 are shown by arrows. In the event of an overvoltage condition, such as an electrostatic discharge (ESD) event, current from the ESD event may flow through IC device 200. For example, if an ESD event occurs between lead 212 and lead 214, current may flow through lead 212, through wire bond 218, through semiconductor die 204, out wire bond 220, and finally out to lead 214. The electronic circuits supported by semiconductor die 204 may include ESD protection circuitry (e.g. ESD clamp circuits and the like) so that the current may flow through semiconductor die 204 without damaging the die or the supported circuitry.

In another example, assume an ESD event occurs between lead 212 and lead 216. In the embodiment shown, lead 212 is coupled to semiconductor die 204 by wire bond 218 and lead 216 is coupled to semiconductor die 202 through wire bond 222. Thus, current flowing from lead 212 to lead 216 may have to flow through both semiconductor die 202 and 204. In this case, current may flow from lead 212, though wire bond 218, and into semiconductor die 204. If semiconductor die 202 and 204 are electrically isolated, as described above, the current may then jump or arc from semiconductor die 204 to semiconductor die 202. The current may then flow through semiconductor die 202, out to wire bond 222, and finally out to lead 216. If current jumps or arcs from semiconductor die 204 to semiconductor die 202, the electrical arc (and/or heat associated with the electrical arc) may potentially cause damage to one or more of semiconductor die 202 or 204 or to the die attach adhesive.

Figure 3:
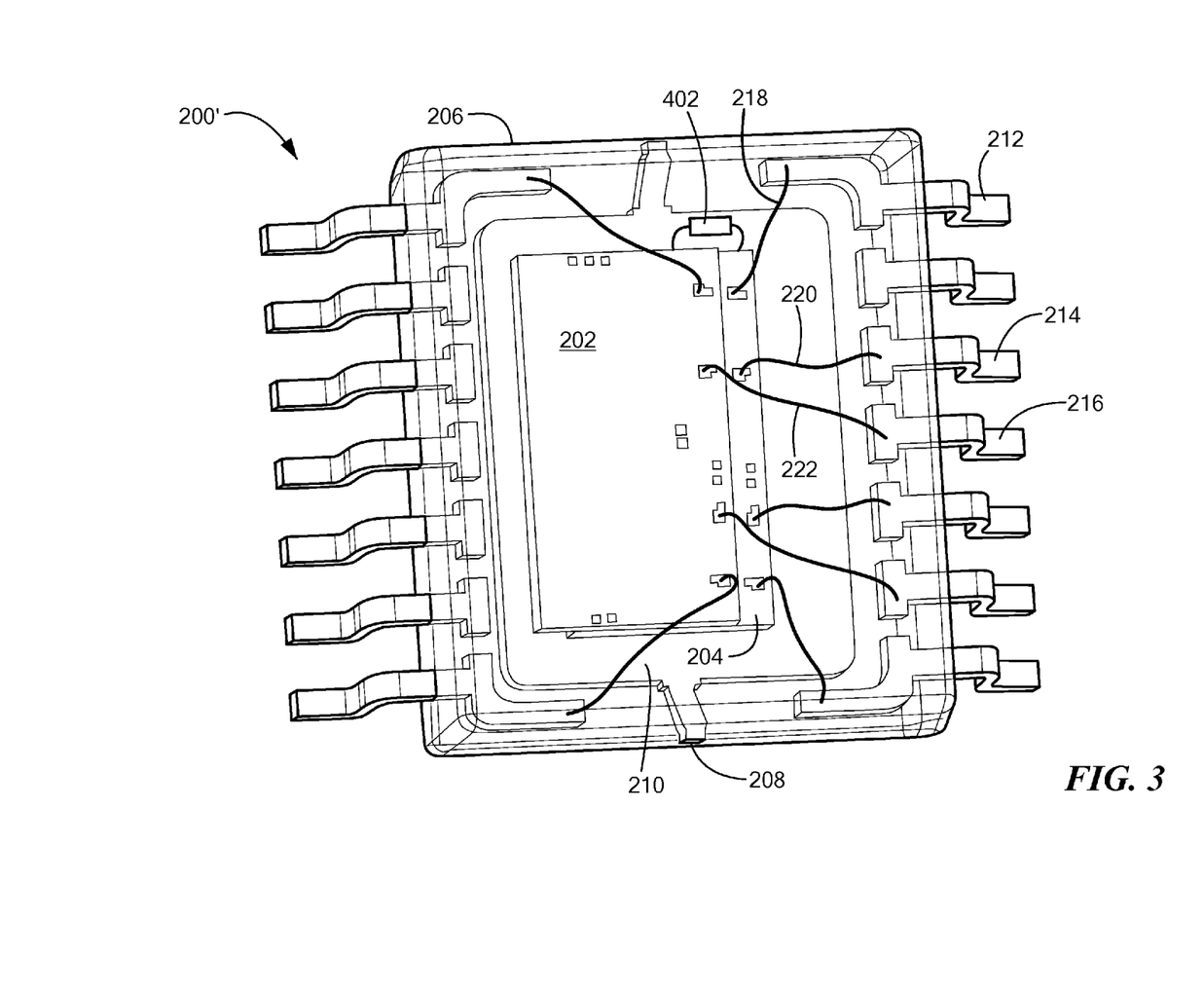
FIG. 3 is an isometric view of an integrated circuit device having multiple die and capacitive ESD coupling.

FIG. 3 is an isometric view of another embodiment of an IC device 200'. IC device 200' includes a capacitor 402 electrically coupled between semiconductor die 202 and semiconductor 204. In an embodiment, capacitor 402 is electrically connected between a DC voltage node of semiconductor die 202 and semiconductor die 204, such as a ground node or a power node. Capacitor 402 may be coupled between two ground nodes, between two power nodes, between a ground node on one die and a power node on the other, or between any other Input/Ooutput or DC signal or node on either die.

Capacitor 402 may provide capacitive coupling between semiconductor die 202 and semiconductor die 204 which may electrically isolate semiconductor die 202 and 204 at low frequency or DC frequency (i.e. zero frequency), but may allow higher frequency current to flow between the die, such as higher frequency current due to an ESD event for example. In an embodiment, the capacitive coupling may act as a high-pass filter, which will be discussed below.

In the case of an ESD event between leads 212 and 216, high frequency current such as ESD current may flow from lead 212, through wire bond 218, through semiconductor device 204, through capacitor 402, through semiconductor 202, through wire bond 222, and finally out to lead 216.

In one example, lead 214 may be coupled to a ground node of integrated circuit device 204 and lead 216 may be coupled to a ground node of semiconductor die 202. Capacitor 402 may be coupled directly between lead 216 and lead 214, which may be ground nodes, as shown in FIG. 3. In other embodiments, capacitor 402 may be indirectly coupled to the ground nodes of the semiconductor die by being directly coupled to a conductor that is electrically coupled to the ground node, such as wire bond 220, wire bond 222, lead 214, and/or lead 216.

Capacitor 402 may be positioned anywhere that provides a conduction path between semiconductor die 202 and 204. Capacitor 402 may be positioned adjacent to or coupled to semiconductor die 202 and/or semiconductor die 204. In another embodiment, capacitor 402 may be positioned or coupled to pads on semiconductor die 202 and/or semiconductor die 204. In another example, capacitor 402 may be positioned adjacent to leads 214 and 216, or between leads 214 and/or 216 and semiconductor die 202 and/or 204. In another embodiment, capacitor 402 may be coupled to wire bonds 220 and/or 222. In another embodiment, capacitor 402 may be coupled to leads at a point external to package 206.

In the case of an ESD event, the conduction path provided by capacitor 402 may provide a conduction path for the ESD-related current to flow from one semiconductor die to the other. This may prevent or reduce the chance of an electrical arc between the semiconductor die, and thus prevent or reduce the chance of damage due to arcing or heat.

Figure 4:
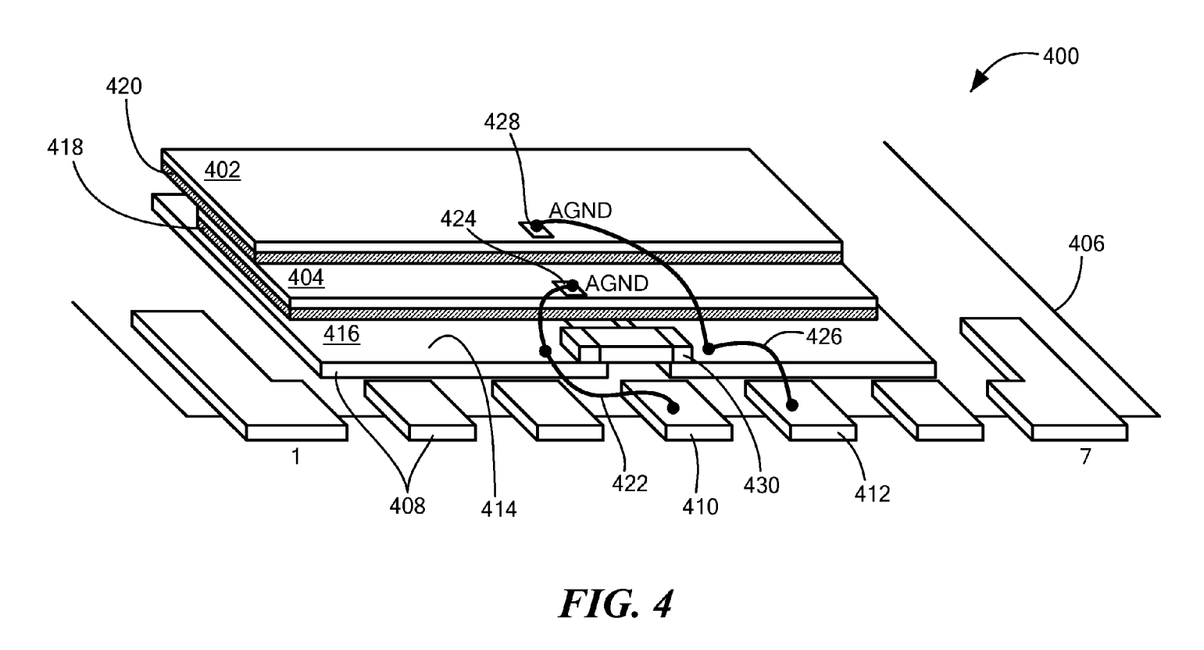
FIG. 4 is an isometric view of an integrated circuit device having multiple die and capacitive ESD coupling.

Referring to FIG. 4, integrated circuit device 400 may be the same as or similar to integrated circuit device 200'. Integrated circuit device 400 may include a semiconductor die 402 and a semiconductor die 404, which may be the same as or similar to semiconductor die 202 and/or 204. A package (indicated by outline 406) may house a lead frame 408 that provides electrical connection between semiconductor die 402 and 404 and external leads, such as leads 410 and 412.

In an embodiment, lead frame 408 may be a so-called split lead frame having two or more die attach portions, such as die attach portion 414 and die attach portion 416 across which a die is attached. Die attach portions 414 and 416 may be electrically isolated from each other so that current does not flow between them.

Die attach portions 414 and 416 may provide a platform onto which semiconductor die 202 and/or 204 can be attached. In the embodiment shown in FIG. 4, semiconductor die 404 may lie across both die attach portion 414 and 416, and may be attached to each with a non-conductive adhesive 418 such as an epoxy or adhesive tape as examples. Non-conductive adhesive 418 may act as an insulator between semiconductor die 404 and the die attach portions 414 and 416.

Also as shown, semiconductor die 402 may be attached to a top-surface of semiconductor die 404 with non-conductive adhesive 420. Here, non-conductive adhesive 420 may also serve as an insulator that electrically isolates semiconductor die 402 from semiconductor die 404.

Although semiconductor die 402 and 404 are shown in a cascaded arrangement, one skilled in the art will recognize that any other physical arrangements of semiconductor die 402 and 404 within package 406 are possible. For example, semiconductor die 402 and 404 may be arranged side-by-side, back-to-back, etc.

In an embodiment, die attach portion 414 may be coupled to a ground node of semiconductor die 404 by wire bond 422 and ground bond pad 424. Similarly, die attach portion 416 may be coupled to a ground node of semiconductor die 402 by wire bond 426.

Integrated circuit device 400 may also include capacitor 430 coupled between die attach portion 414 and die attach portion 416. Capacitor 430 may provide a capacitive coupling between die attach portions 414 and 416 that allows ESD-related current to flow between die attach portions 414 and 416, but also blocks current from flowing between die attach portions 414 and 416 at low frequency or DC.

Electrostatic discharge events that affect integrated circuit devices often consist of high voltage spikes that discharge quickly through the device. For example, a worker walking across a factory floor may build up a static charge in the range of 15 kV before touching a device. When the worker touches external pins, current may spike through the device potentially causing damage. Due to the transient nature of electrostatic discharge, much of the current that flows through the device due to an ESD event may have high-frequency or transient frequency components. Thus, in an embodiment, some or all of the current associated with an ESD event may flow through capacitor 430.

In certain embodiments, a 2 KV human body model ESD pulse may be exponential and may have a rise time from about 2 ns to about 10 ns. The expected pulse peak can reach about 1.2 A to about 1.4 A. The exponential decay or decay time (td) may be between about 130 ns and about 170 ns for a 2 KV level discharge.

For example, in case of an ESD event between leads 410 and 412, ESD-related current may flow from lead 410, through wire bond 422, to die attach portion 414, through capacitor 430, to die attach portion 416, throughout wire bond 426 and out to lead 412. The current may also flow in the opposite direction depending on the polarity of the ESD event. As another example, in the case of a DC voltage applied across leads 410 and 412, capacitor 430 may electrically isolate semiconductor die 402 from semiconductor die 404 by blocking DC current from flowing between die attach portions 414 and 416.

Figure 5:
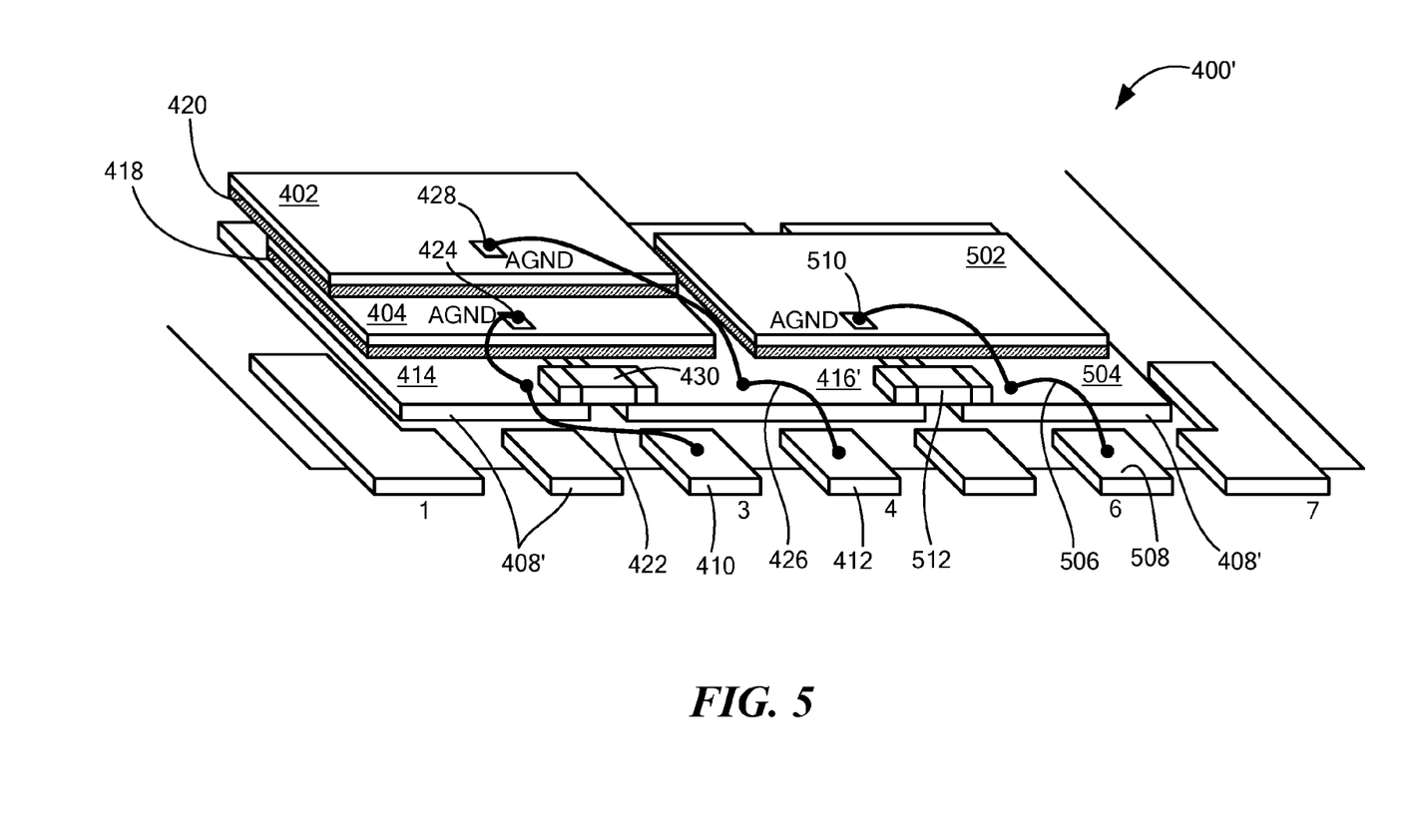
FIG. 5 is an isometric view of an integrated circuit device having multiple die and capacitive ESD coupling.

Referring to FIG. 5, integrated circuit device 400' may be the same as or similar to integrated circuit device 400, including semiconductor die 402 and 404 arranged in a cascaded fashion. In addition, integrated circuit device 400' may include an additional semiconductor die 502, which may be the same as or similar to semiconductor die 402 and/or 404. Semiconductor die 502 may support a circuit that is the same as or different from the circuits supported by semiconductor die 402 and/or 404.

Lead frame 408' may include three die attach portions 414, 416', and 504. Semiconductor die 404 may lie across both die attach portion 414 and 416', and semiconductor die 502 may lie across die attach portions 416' and 504. Like semiconductor die 404, semiconductor die 502 may be attached to die attach portions 416' and 504 with a layer of non-conductive adhesive 406.

In embodiments, die attach portions 414, 416', and 504 may be electrically isolated from each other and may be coupled to ground (or other) voltage nodes of the semiconductor die. For example, as described above, wire bond 422 may couple together lead 410, die attach portion 414, and a ground node of semiconductor die 404; and wire bond 426 may couple together lead 412, die attach portion 416', and a ground node of semiconductor die 402. Similarly, wire bond 506 may couple together lead 508, die attach portion 504, and a ground node (shown by bond pad 510) of semiconductor die 502.

As described above, capacitor 430 is coupled between die attach portions 414 and 416' to create a conduction path in the case of an ESD event. Similarly, capacitor 512 is coupled between die attach portions 416' and 504 to provide a similar conduction path.

Depending on which leads are involved in the ESD event, the conduction path may include capacitor 430, capacitor 512, or both. In case of an ESD event between leads 410 and 412, ESD-related current may flow from lead 410, through wire bond 422, to die attach portion 414, through capacitor 430, to die attach portion 416', through 426 wire bond and out to lead 412. The current may also flow in the opposite direction depending on the polarity of the ESD event. As another example, in the case of a DC voltage applied across leads 410 and 412, capacitor 430 may electrically isolate semiconductor die 402 from semiconductor die 404 by blocking DC current from flowing between die attach portions 414 and 416'.

In case of an ESD event between leads 412 and 508, ESD-related current may flow from lead 412, through wire bond 426, to die attach portion 416', through capacitor 512, to die attach portion 504, through wire bond 506, and out to lead 508. The current may also flow in the opposite direction depending on the polarity of the ESD event. In the case of a DC voltage applied across leads 412 and 508, capacitor 512 may electrically isolate semiconductor die 502 from semiconductor die 404 by blocking DC current from flowing between die attach portions 504 and 416'.

In case of an ESD event between leads 410 and 508, ESD-related current may flow from lead 410, through wire bond 422, to die attach portion 414, through capacitor 430, to die attach portion 416', through capacitor 512, to die attach portion 504, through wire bond 506, and out to lead 508. The current may also flow in the opposite direction depending on the polarity of the ESD event. In the case of a DC voltage applied across leads 410 and 508, capacitor 512 may electrically isolate semiconductor die 502 from semiconductor die 404 by blocking DC current from flowing between die attach portions 504 and 416', and capacitor 430 may electrically isolate semiconductor die 404 from semiconductor die 402 by blocking DC current from flowing between die attach portions 416' and 414.

One skilled in the art will recognize that additional die and capacitive couplings may be included in integrated circuit device 400'. One skilled in the art will also recognize that the capacitive couplings may be arranged in series or parallel configurations.

Figure 6:
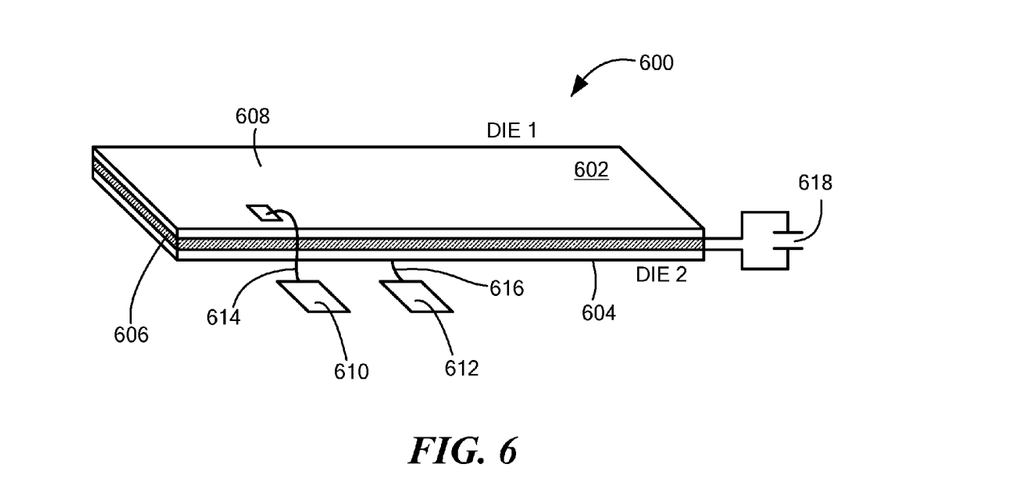
FIG. 6 is an isometric view of an integrated circuit device having multiple die arranged in a back-to-back configuration and capacitive ESD coupling.

Turning to FIG. 6, an integrated circuit device 600 includes two or more semiconductor die 602 and 604 arranged so that a bottom surface of semiconductor die 602 is facing a bottom surface of semiconductor die 604. Bottom surface refers to the surface of the substrate opposite the surface supporting active elements, such as electronic circuit components.

A material layer 606 may be sandwiched between semiconductor die 602 and 604 and may provide a capacitive coupling between the die. The bottom surfaces of die 602 and 604 (i.e. the surfaces of each die that are in contact with material layer 606) may be ground nodes or ground planes, and will be referred to as such for ease of discussion. However, in other embodiments, the bottom surface of die 602 and 604 may be power nodes or planes, or any other DC voltage node.

Integrated circuit device 600 may also include lead 610 electrically coupled to the ground node of semiconductor die 602 by wire bond 614, and lead 612 electrically coupled to the ground node of semiconductor die 604 by wire bond 616. Although not shown, integrated circuit device 600 may also include a package and a lead frame having additional leads, wire bonds, die attach portions, etc.

In embodiments, material layer 606 may be or may act as a dielectric material that provides a capacitive coupling between semiconductor die 602 and 604. In certain instances, material layer 606 may be an adhesive having dielectric properties used to adhere semiconductor die 602 and 604 to each other. Material layer 606 may be modeled as a capacitor, as indicated by capacitor symbol 618.

In the case of an ESD event occurring between leads 610 and 612, current may flow from lead 610, through wire bond 614, through semiconductor die 602, through material layer 606, through semiconductor die 604, through wire bond 616, and out to lead 612. Current may also flow in the opposite direction depending on the polarity of the ESD event.

Figure 7:
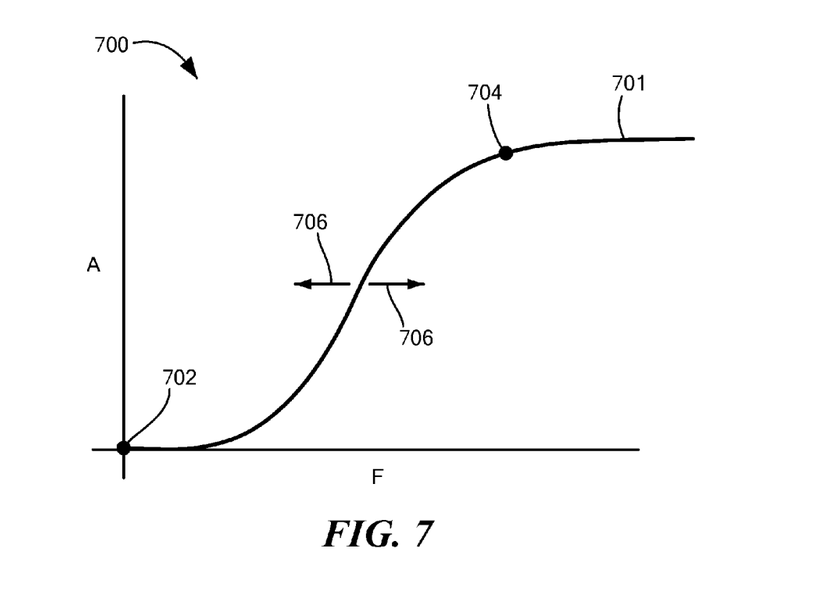
FIG. 7 is a graph showing a transfer function.

Referring to FIG. 7, graph 700 illustrates a transfer function 701 of a capacitive coupling such as capacitor 430, capacitor 512, and/or material layer 606. The horizontal axis represents frequency and the vertical axis represents current through the capacitive coupling. At DC (i.e. 0 Hz, represented by point 702, current through the capacitive coupling is zero).

In a simplified model, the transfer function created by the capacitive coupling is similar or the same as the transfer function of a resistive-capacitive high-pass filter, i.e. a resistor and capacitor in series. In the embodiments shown, the resistance through the conduction path created by the capacitive coupling is relatively low and may be on the order of one Ohm or less. At higher frequencies, for example at point 704, current may flow through the capacitive coupling. The capacitance value of capacitor 430, capacitor 512, or material layer 606 can shift the transfer function characteristic curve to higher or lower frequencies, as indicated by arrows 706. For example, a larger capacitance may shift the transfer function characteristic curve to the left and a smaller capacitance may shift the transfer function characteristic curve to the right.

In an embodiment, the capacitive value of the capacitive coupling can be chosen so that the rise in the characteristic curve occurs at a frequency lower than the frequencies associated with ESD events. Thus, the capacitive coupling will allow current at higher frequencies associated with the ESD event to flow, but will block current at lower frequencies such as DC or zero frequency from flowing between the semiconductor die, thus isolating the semiconductor die from each other at lower frequencies. In an embodiment, the capacitance value of the capacitive coupling may be about 2.2 nF up to about 220 nF. The capacitive coupling may be rated at up to about 50V.

Although described as a lead-frame based package, the features described above can also be applied in conjunction with other types of packages. For example, a capacitive coupling between the first and second semiconductor die to allow electrostatic discharge to flow between the die can be used in conjunction with package types including, but not limited to: flip-chip, combination of flip-chip with wire-bonding, 3-D IC stacks, wafer-level 3-D stacks, side-by-side or stacked on interposer, etc. In these instances, the capacitive coupling can be electrically coupled to one or more connections such as: a wire bond, a bump or micro-bump (e.g. for stacked or side by side flip chip packages), a through-silicon via (TSV) connection (e.g. for 3-D stacked die packages), a directly joined metal interconnect (e.g. for 3-D bonded wafer stacks), etc.

One skilled in the art will recognize that the physical arrangements of the semiconductor die in integrated circuit devices 200, 200', 400, 400', and 600 are not limited to those shown in the figures. Any physical arrangement of die that allows for capacitive coupling between the die may be used.

Having described exemplary embodiments of the invention, one of ordinary skill in the art may recognize that other embodiments incorporating the concepts fall within the scope of the claims. The embodiments described should not be limited to disclosed embodiments but rather should be defined by the claims. All publications and references cited in this document are incorporated here by reference in their entirety.

The invention claimed is:

1. An apparatus comprising: a package;
   a plurality of external leads extending outside the package;
   a first die within the package having one or more first contacts electrically coupled to at least a first one of the external leads;
   a second die within the package having one or more second contacts electrically coupled to at least a second one of the external leads; and
   a capacitor coupled between the first and second die to allow an electrostatic discharge (ESD) current to flow between the first die and the second die in response to an ESD event and to electrically isolate the first and second die from each other in the absence of the ESD event;
   wherein the capacitor is coupled directly one the one or more first and/or the one or more second contacts.

2. The apparatus of claim 1 further comprising a lead frame comprising the plurality of external leads and at least one die attach pad.

3. The apparatus of claim 2 wherein the capacitor is coupled to the lead frame.

4. The apparatus of claim 2 wherein the lead frame comprises two or more die attach pads and the capacitor is coupled between at least two of the die attach pads.

5. The apparatus of claim 1 wherein the capacitive coupling is coupled between a ground node of the first die and a ground node of the second die.

6. The apparatus of claim 1 further comprising a plurality of die, each die having a respective plurality of contacts; and
   a plurality of capacitors, each capacitor coupled between at least one contact of the plurality of contacts of one of the plurality of die and at least one contact of the plurality of contacts of another of the plurality of die.

7. The apparatus of claim 1 wherein a type of the package may comprise one or more of: a flip-chip, a combination of flip-chip with wire-bonding, a 3-D IC stacks, a wafer-level 3-D stacks, a side-by-side, or a stacked on interposer.

8. The apparatus of claim 1 wherein the capacitor provides a capacitive coupling having a transfer function that allows current having a frequency above a predetermined threshold to flow through the capacitive coupling and blocks current have a frequency below the predetermined threshold from flowing through the coupling.

9. The apparatus of claim 8 wherein the capacitive coupling blocks DC current from flowing through the capacitive coupling.

10. An apparatus comprising:
    a package;
    a plurality of external leads extending outside the package;
    a first die within the package having one or more first contacts electrically coupled to at least a first one of the external leads;
    a second die within the package having one or more second contacts electrically coupled to at least a second one of the external leads; and
    a capacitor coupled between the first and second die to allow an electrostatic discharge (ESD) current to flow between the first die and the second die in response to an ESD event and to electrically isolate the first and second die from each other in the absence of the ESD event;

wherein the capacitor is coupled directly to at least one of the plurality of external leads.

11. The apparatus of claim 10 further comprising a lead frame comprising the plurality of external leads and at least one die attach pad.

12. The apparatus of claim 11 wherein the capacitor is coupled to the lead frame.

13. The apparatus of claim 11 wherein the lead frame comprises two or more die attach pads and the capacitor is coupled between at least two of the die attach pads.

14. The apparatus of claim 10 wherein the capacitor coupling is coupled between a ground node of the first die and a ground node of the second die.

15. The apparatus of claim 10 further comprising a plurality of die, each die having a respective plurality of contacts; and a plurality of capacitors, each capacitor coupled between at least one contact of the plurality of contacts of one of the plurality of die and at least one contact of the plurality of contacts of another of the plurality of die.

16. The apparatus of claim 10 wherein a type of the package may comprise one or more of: a flip-chip, a combination of flip-chip with wire-bonding, a 3-D IC stacks, a wafer-level 3-D stacks, a side-by-side, or a stacked on interposer.

17. The apparatus of claim 10 wherein the capacitor provides a capacitive coupling having a transfer function that allows current having a frequency above a predetermined threshold to flow through the capacitive coupling and blocks current have a frequency below the predetermined threshold from flowing through the coupling.

18. The apparatus of claim 10 wherein the capacitive coupling blocks DC current from flowing through the capacitive coupling.

* * * * *

UNITED STATES PATENT AND TRADEMARK OFFICE
CERTIFICATE OF CORRECTION

PATENT NO. : 9,941,224 B2
APPLICATION NO. : 15/245699
DATED : April 10, 2018
INVENTOR(S) : Washington Lamar et al.

Page 1 of 1

It is certified that error appears in the above-identified patent and that said Letters Patent is hereby corrected as shown below:

In the Specification

Column 4, Line 4, replace ";" with --,--

Column 4, Line 5, replace ";" with --,--

Column 5, Line 31, replace "are" with --arc--

Column 5, Line 43, replace "Ooutput" with --output--

Signed and Sealed this
Sixteenth Day of October, 2018

Andrei Iancu
*Director of the United States Patent and Trademark Office*